United States Patent
Komatsu

Patent Number: 5,818,849
Date of Patent: Oct. 6, 1998

[54] IC TESTING APPARATUS

[75] Inventor: Toshio Komatsu, Tochigi-ken, Japan

[73] Assignee: Nippon Precision Circuits Inc., Tokyo, Japan

[21] Appl. No.: 721,428

[22] Filed: Sep. 27, 1996

[30] Foreign Application Priority Data

Sep. 29, 1995 [JP] Japan ................................. 7-253479

[51] Int. Cl.⁶ ................................................. G01R 31/28
[52] U.S. Cl. ......................................... 371/22.1; 327/41
[58] Field of Search ............................. 371/22.1, 22.36, 371/22.5, 25.1, 27.5, 27.7, 22.6, 24, 28; 395/183.06, 183.15; 365/550; 324/763, 765; 327/90, 77, 40, 37, 24

[56] References Cited

U.S. PATENT DOCUMENTS

| | | | |
|---|---|---|---|
| 5,471,484 | 11/1995 | Kawasaki | 371/25.1 |
| 5,588,006 | 12/1996 | Nozuyama | 371/3 |
| 5,619,512 | 4/1997 | Kawashima et al. | 371/22.5 |
| 5,659,553 | 8/1997 | Suzuki | 371/25.1 |
| 5,663,970 | 9/1997 | Bae | 371/61 |

*Primary Examiner*—Albert Decady
*Assistant Examiner*—Nadeem Iqbal
*Attorney, Agent, or Firm*—Jordan and Hamburg

[57] ABSTRACT

An IC testing apparatus has a detecting circuit for detecting an inversion of an output state of a test output from an IC under test in response to application of a clock signal, a comparing circuit for comparing a value preset in a storage circuit with the output state of the test output and an output state of the detecting circuit. In a first comparison operation, the number of pulses of the clock signal applied to the IC under test is less than the number of pulses required to invert the output state of the test output by one pulse and the test output and detector output are compared with corresponding values preset in the storage circuit at times coincident with a test strobe signal synchronized with the clock signal. In a second comparison operation, another clock pulse is applied to the IC under test to make the total number of pulses equal to that needed for inverting the test output and the above comparisons are again made with corresponding preset values. A control circuit the determines whether the IC under test is good based on the comparison results.

24 Claims, 4 Drawing Sheets

```
         B    0 1      1 0      0 1
         D    0 1      0 1      0 1
```

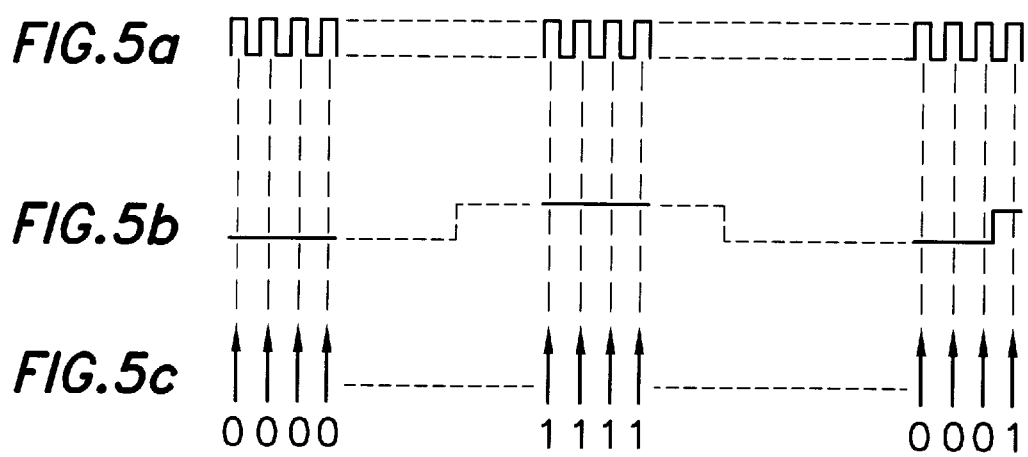

IC TESTING APPARATUS

BACKGROUND OF THE INVENTION

The present invention relates to an integrated circuit (IC) testing apparatus, and more particularly, to an IC testing device having compact circuitry capable of time efficient testing of IC's.

Various IC test equipment configurations are known. One conventional IC test apparatus is shown in FIG. 4 in block diagram form. The test apparatus performs tests upon IC 21 to determine its functionality. The IC 21 is generally referred to as the "device under test" (hereinafter "DUT"). In the following description the IC 21 is the DUT and is a counter for the purpose of example. FIG. 5 is a timing chart for showing operations of the IC testing apparatus.

A clock signal "a" is inputted from a clock generating circuit 22 to an IC 21 under test. When a number pulses of clock signal "a" reaches a predetermined count value, an output signal "b" from the IC 21 under test is inverted. A storage circuit 23 stores values (hereinafter "expected values") which are output from the IC 21 during normal operation when a given clock signal "a" is generated. The output signal "b" of the IC 21 under test is compared with the expected value stored in the storage circuit 23 in a comparator at each test time "c" synchronized with the clock signal "a". A comparison result is transferred to a control circuit 25 which determines whether the IC 21 under test is operating normally. Normal operation is indicated when the output signal "b" is coincident with and equal to the expected value at all test times "c" synchronized with the clock "a".

In the above-described conventional IC testing apparatus, the output signal "b" from the IC 21 under test must be compared with the expected value from the storage circuit 23 at all of the timings synchronized with the clock signal "a". As a result, when the test is executed in a software manner, an large amount of time is required. Alternatively, when such a test is executed in a hardware manner, conventionally, the scale of the testing circuit becomes large.

SUMMARY OF THE INVENTION

An object of the present invention is to provide an IC testing apparatus having a simple hardware structure and which is capable of performing a test within a short time period.

Briefly stated, the present invention provides an IC testing apparatus having a detecting circuit for detecting an inversion of an output state of a test output from an IC under test in response to application of a clock signal, and a comparing circuit for comparing a value preset in a storage circuit with the output state of the test output and an output state of the detecting circuit. In a first comparison operation, the number of pulses of the clock signal applied to the IC under test is less than the number of pulses required to invert the output state of the test output by one pulse and the test output and detector output are compared with corresponding values preset in the storage circuit at times coincident with the clock signal. In a second comparison operation, another clock pulse is applied to the IC under test to make the total number of pulses equal to that needed for inverting the test output and the above comparisons are again made with corresponding preset values. A control circuit then determines whether the IC under test is good based on the comparison results.

In accordance with these and other objects of the invention, there is provided an IC testing apparatus comprising: a detecting circuit for detecting an inversion of an output state of a tested output from an IC under test; a comparing circuit for comparing the output states of the tested output and of the detecting circuit with predetermined values, respectively, when the IC receives a number of pulses in a clock signal smaller by 1 than that number of pulses required for inverting the tested output, and also for comparing the output states of the tested output and of the detecting circuit with predetermined values, respectively, when the IC receives a number of pulses equal to the number of pulses required for inverting the tested output; and a judging circuit for judging as to whether or not the IC under test is good based on the comparison results obtained from the comparing circuit.

The present invention further provides an embodiment of the detecting circuit including first and second flip-flops configured to set upon application of a clocking pulse, means for applying the tested output to a clock input of the first flip-flop, an inverter for applying an inversion of the tested output to a clock input of the second flip-flop, and an OR gate for ORing together outputs from the first and cecond flip flops to provide an output of the detecting circuit.

The present invention also provides a test apparatus for testing a DUT, comprising: a pulse generator for generating predetermined numbers of pulses for application to the DUT; an inversion detecting means for detecting inversions of a DUT output of the DUT and producing an inversion detection output indicative of whether an inversion has occurred, the inversion output being resettable; a comparing circuit means for comparing the DUT output with a first expected state and for comparing the inversion detection output with a second expected state and producing a comparison result output indicative of the comparisons; storage means for storing expected states, including the first and second expected states, and applying the expected states to the comparing circuit means; and control means for controlling the pulse generator, the storage means and the inversion detecting means, and for reading the comparison result output.

According to a still further feature of the invention, there is further provided in the above test apparatus: first means for commanding the pulse generator to output pulses to the DUT; second commanding means for commanding the storage means to apply the first and second expected values to the comparing circuit means prior to the occurrence of the n−1 pulses where the first and second expected states correspond with the DUT output and the inversion comparison output, respectively, when the DUT functions correctly following application of the n−1 pulses, and where the DUT output becomes inverted following application of n pulses; first reading means for reading in the comparison result output following application of the n−1 pulses as a pre-inversion comparison result; third commanding means for resetting the comparison result output and commanding the storage means to apply a second set of the first and second expected values to the comparing circuit means subsequent to reading in the pre-inversion comparison result, where the first and second expected values of the second set correspond with the DUT output and the inversion comparison output, respectively, when the DUT functions correctly following application of a total of the n pulses; second reading means for reading in the comparison result output following application of the n pulses as a post-inversion comparison result; and determining means for determining whether any of the pre-inversion result and the post-inversion result are a negative result and indicating that the DUT is unacceptable in response to the negative result.

According to still another feature of the invention, there is provided a method of testing a DUT comprising the steps of: commanding a pulse generator to output pulses to the DUT where a DUT cutout remains constant without inverting for n−1 pulse and inverts when n pulses are applied; making a first inversion determination as to whether an inversion has occurred during application of n−1 pulses to the DUT; determining whether the first inversion determination corresponds with the DUT functioning normally following application of n−1 pulses; determining whether the DUT output corresponds with the DUT functioning normally following application of n−1 pulses; applying one more pulse to the DUT for a total of n pulses; making a second inversion determination as to whether an inversion has occurred during application of n pulses to the DUT; determining whether the second inversion determination corresponds with the DUT functioning normally following application of n pulses; determining whether the DUT output corresponds with the DUT functioning normally following application of n pulses; and determining that the DUT is unacceptable if any of the above determinations does not correspond with the DUT functioning normally.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 5 is a timing chart for detailing operations of the conventional IC testing apparatus of FIG. 4.

DETAILED DESCRIPTION OF THE INVENTION

Figure 1:
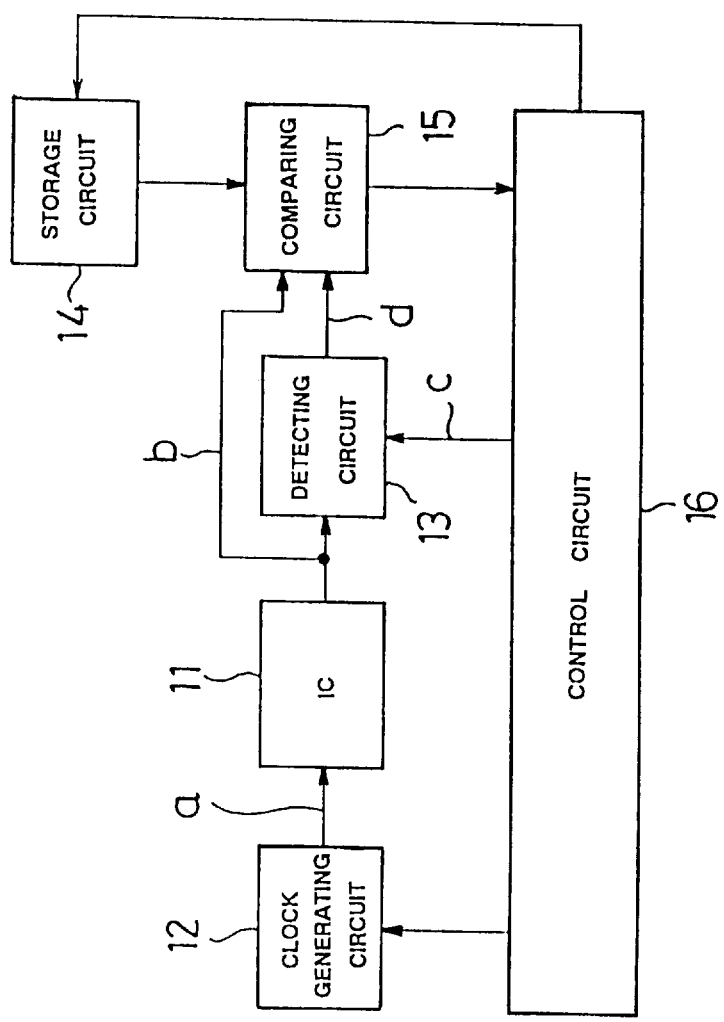
FIG. 1 is a block diagram schematic of an embodiment of an IC testing apparatus according to the present invention.
Figure 2:
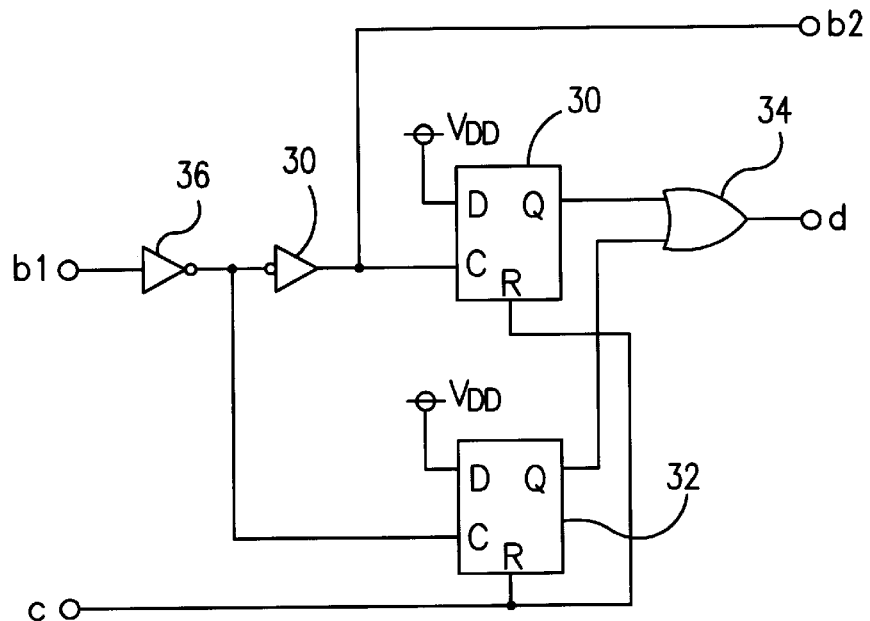
FIG. 2 is a detailed circuit schematic of a portion of the IC testing apparatus of FIG. 1.
Figure 3A:
FIG. 3 is a timing chart for detailing operations of the IC testing apparatus of FIG. 1.
Figure 3B:
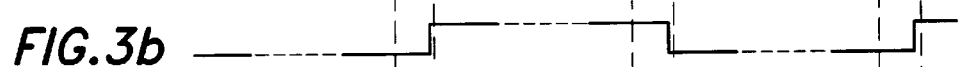
Figure 3C:
Figure 3D:
Figure 4:
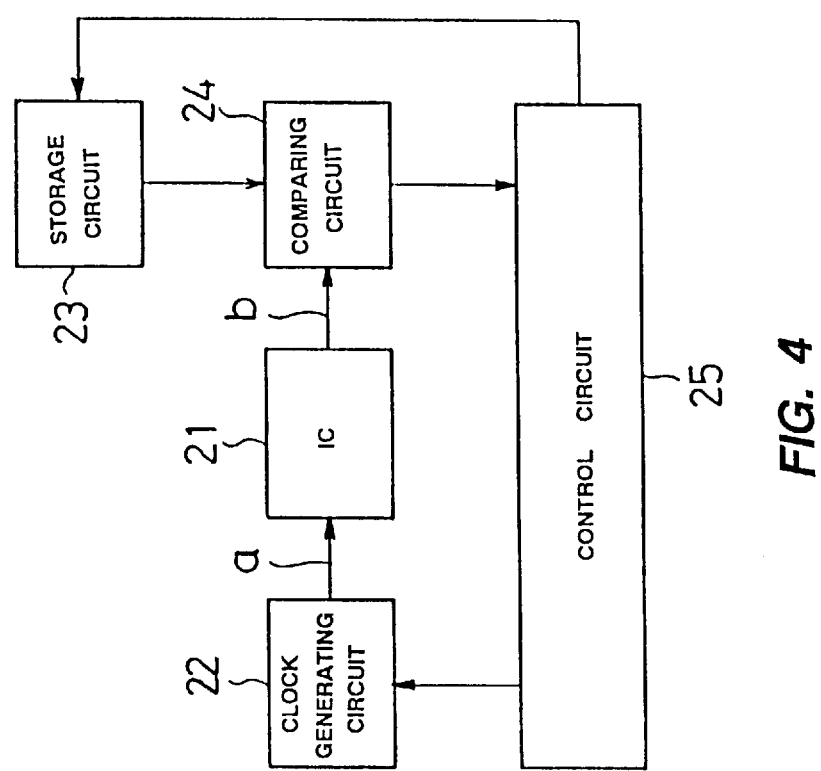
FIG. 4 is a block diagram schematic of a conventional IC testing apparatus.

Referring now to FIGS. 1 through FIG. 3, an embodiment of an IC testing apparatus according to the present invention is shown wherein an IC 11 represents the DUT. In the following description, it is assumed for the purpose of example and not limitation that a counter is employed as the IC 11 under test, and an output state of this counter is inverted each time "n" pulses of a clock signal are input.

A clock generating circuit 12 outputs a clock signal "a" to the IC 11 under test upon receipt of a control signal from a control circuit 16. A detecting circuit 13 detects whether an output signal "b" outputted from the IC 11 under test is inverted or not. The detecting circuit 13 detects an inversion of an output state of the output signal "b" resulting from the normal counting operation by the IC 11 under test, and further detects an instantaneous inversion of the output state such as a noise glitch.

As shown in FIG. 2 in detail, this detecting circuit 13 includes first and second D type flip-flops, 30 and 32, with outputs thereof input to an OR gate 34. A first inverter 36 receives the test input b1 and applies an inversion thereof to the clock input of the second flip-flop 32. A second inverter 38 receives the output of the first inverter 36 and applies an inversion thereof to the clock input of the first flip-flop 30.

It should be noted that signals "b1" and "b2" represented in FIG. 2 are theoretically completely identical to each other. As a consequence, in FIG. 1, the signals "b1" and "b2" are not specifically discriminated from each other, but are represented as a signal "b" for purposes of clarity.

A storage circuit 14 stores a value (hereinafter "value B") which is outputted from the IC 11 under test if the IC 11 under test is operating correctly and also another value ( hereinafter a "value D", the value B and the value D being called expected values") which is outputted from the detecting circuit 13 when the IC 11 under test is operating correctly. A comparing circuit 15 compares the output signal "b" from the IC 11 under test and the output signal "d" from the detecting circuit 13 with the expected values "B" and "D" stored in the storage circuit 14, respectively, at a predetermined timing, and then sends the comparison result to a control circuit 16. The control circuit 16 is realizable in various forms by those of ordinary skill in the art and, hence, the details thereof are omitted for purposes of clarity. For purposes of example only, a personal computer is optionally usable as the control circuit.

The control circuit 16 delivers a predetermined control signal to the clock generating circuit 12, the detecting circuit 13, and the storage circuit 14, and determines whether the IC 11 under test is good based upon the comparison results derived from the comparing circuit 15.

Referring to FIG. 3, a timing chart detailing operations of the IC testing apparatus shown in FIG. 1 and FIG. 2 is shown. In response to the control signal supplied from the control circuit 16, (n−1) pulses of the clock signal "a" are generated by the clock generating circuit 12 and applied to the IC 11 under test. The number (n−1) of clock pulses is smaller than the "n" number of clock pulses required for inversion of the output signal "b" by one clock pulse. In other words, the output state of the IC 11 under test is inverted when "n" pulses of the clock signal "a" are supplied to this IC 11 under test.

Following the application of (n−1) clock pulses, the comparing circuit 15 performs the comparison operation to check whether or not the output signal "b" from the IC 11 under test and the output signal "d" from the detecting circuit 13 are equal to the expected values "B" and "D" stored in the storage circuit 14 (hereinafter referred to as a "comparison operation before inversion"), respectively. Then, a comparison result is supplied to the control circuit 16.

When the IC 11 under test is operating normally, as shown in FIG. 3, both the signals "b" and "d" are equal to logic values "0", and thus are coincident and equal to the expected values "B" and "D" stored in the storage circuit 14, respectively. If the IC 11 under test is not operating normally, for instance, if the output from the IC 11 under test has been inverted, or a noise glitch occurs, at least one incongruity will occur between the value of the signal "b" and the expected value B, and between the value of the signal "d" and the expected value D. When the comparison operation is accomplished, the detecting circuit 13 is reset in response to the control signal "c" derived from the control circuit 16. This is effected by resetting the two D type flip-flops 30 and 32 shown in FIG. 2.

After the resetting operation is ended, only 1 clock pulse of clock signal "a" is produced by the clock generating circuit 12 in response to the control signal supplied from the control circuit 16, and the one clock pulse of the clock signal "a" is applied to the IC 11 under test. If the IC 11 under test is operating normally, then the output signal "b" of the IC 11 under test is inverted from the logic value "0" to the logic value "1" in response to this clock signal. At this stage, the comparing circuit 15 again performs the comparison operation to check whether or not the output signal "b" from the IC 11 under test and the output signal "d" from the detecting circuit 13 are equal to the expected values "B" and "D" stored in the storage circuit 14 ( hereinafter referred to as a "comparison operation after inversion"). The comparison result is then sent to the control circuit 16. If the IC 11 under test is operating normally, then the logic values of both the output signals "b" and "d" are "1", as represented in FIG. 3, and thus are coincident with the expected values "B" and "D" stored in the storage circuit 14, respectively. In the case that the IC 11 under test is not operating normally, and, for example, the output signal from the IC 11 under test is not inverted, the value of the output signal "b" is not coincident with the expected value "B", and also the value of the output signal "d" is not coincident with the expected value "D". When this comparison operation is complete, the detecting circuit 13 is again reset in response to the control signal "c" derived from the control circuit 16.

When the resetting operation is complete, (n−1) pulses of clock signals "a" are again produced by the clock generating circuit 12, so that a sequential operation similar to the above-explained sequential operation is carried out. In the comparison operation before inversion of the output state. If the IC 11 under test is operating normally, then the logic value of the signal "b" is "1" and the logic value of the signal "d" is "0", as shown in FIG. 3, which are made coincident with the expected values "B" and "D" stored in the storage circuit 14, respectively. In the comparison operation after inversion of the output state, if the IC 11 under test is operating normally, then the logic value of the signal "b" is "0" and the logic value of the signal "d" is "1", as represented in FIG. 3, and are coincident with the expected values "B" and "D" stored in the storage circuit 14.

The comparison operation before inversion and the comparison operation after inversion are successively carried out in a similar manner to compare the values of the output signals "b" and "d" with the expected values "B" and "D", respectively. When the values of the signals "b" and "d" are coincident with and equal to the expected values "B" and "D" during all comparison operations, the control circuit 16 will determine that the IC 11 under test is operating normally and is an acceptable product. To the contrary, if one negative comparison result occurs, the control circuit 16 determines that the IC 11 under, test is not an acceptable product unit.

As described above, (n−1) pulses of clock signals are continuously produced during a time period in which no comparison operation with the expected values is performed by the IC testing apparatus. As a consequence, the (n−1) number of clock pulses can be produced at high speed, allowing the test procedure to be executed within a short time period and permitting the IC testing apparatus to be implemented by a simple hardware structure. Additionally, the detecting circuit 13 is capable of detecting failures such as that of noise glitches which might be produced by the DUT.

In the above description a counter is used as an example of a DUT to demonstrate operation of the IC test apparatus. However, the counter is merely one possible example. The IC testing apparatus of the present invention is capable of testing various types of IC's and is particularly suitable for testing IC's which contain a large number of sequential circuits.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An IC testing apparatus for testing an IC under test, comprising:
    a detecting circuit means for detecting an inversion of an output state of a test output of said IC under test, responsive to an edge transition of said test output, and for setting a detection output of said detecting circuit means to a state indicative of said inversion occurring when said edge transition of said test output occurs, said detecting circuit means including reset means for resetting said detection output;
    a comparing circuit means for performing a first comparison comparing output states of said test output and of said detection output of said detecting circuit means with respective predetermined values when said IC under test receives a number of clock pulses which is less than a number of pulses required to invert said test output by 1, and also for performing a second comparison comparing the output states of said test output and said detection output of said detecting circuit means with respective predetermined values when said IC under test receives a number of clock pulses equal to the number of pulses required to invert said test output; and
    a control circuit means for determining whether said IC under test is acceptable based on a comparison result obtained from said comparing circuit means after each of said first comparison and said second comparison and for actuating said reset means to reset said detection output after each of said first comparison and said second comparison.

2. An IC testing apparatus for testing an IC under test, comprising:
    a detecting circuit means for detecting an inversion of an output state of a test output of said IC under test;
    said detecting circuit means including:
        first and second flip flops configured to set upon application of a clocking pulse;
        means for applying said test output to a clock input of said first flip flop;
        means for applying an inversion of said test output to a clock input of said second flip flop; and
        means for ORing together outputs from said first and second flip flops to provide an output of said detecting circuit means;
    a comparing circuit means for comparing output states of said test output and of said detecting circuit means with respective predetermined values when said IC under test receives a number of clock pulses which is less than a number of pulses required to invert said test output by 1, and also for comparing the output states of said test output and of said detecting circuit means with respective predetermined values when said IC under test receives a number of clock pulses equal to the number of pulses required to invert said test output; and
    a control circuit means for determining whether said IC under test is acceptable based on a comparison result obtained from said comparing circuit means.

3. The IC testing apparatus of claim 1 further comprising a clock generating means, responsive to said control circuit means, for generating said clock pulses applied to said IC under test.

4. An IC testing apparatus for testing an IC under test, comprising:
- a detecting circuit means for detecting an inversion of an output state of a test output from said IC under test and providing an output indicative of whether said inversion of said output state of said test output has occurred,
- a comparing circuit means for comparing output states of said test output and said output of said detecting circuit means with respective predetermined values when said IC under test receives a number of clock pulses which is less than a number of pulses required to invert said test output by 1, and also for comparing the output states of said test output and said output of said detecting circuit means with respective predetermined values when said IC under test receives a number of clock pulses equal to the number of pulses required to invert said test output;
- a control circuit means for determining whether said IC under test is acceptable based on the comparison result obtained from said comparing circuit means; and
- storage means for storing said predetermined values.

5. A test apparatus for testing a DUT, comprising:
- a pulse generator for generating predetermined numbers of pulses for application to said DUT;
- an inversion detecting means, responsive to an edge transition of a DUT output, for detecting inversions of said DUT output of said DUT and setting an inversion detection output to a state indicative of an inversion occurring in response to said edge transition occurring, said inversion detection output being resettable;
- a comparing circuit means for comparing said DUT output with a first expected state and for comparing said inversion detection output with a second expected state and producing a comparison result output indicative of said comparisons;
- storage means for storing expected states, including said first and second expected states, and for applying said expected states to said comparing circuit means; and
- control means for controlling said pulse generator, said storage means and said inversion detecting means, and for reading said comparison result output.

6. A test apparatus for testing a DUT, comprising:
- a pulse generator for generating predetermined numbers of pulses for application to said DUT;
- an inversion detecting means for detecting inversions of a DUT output of said DUT and setting an inversion detection output to a state indicating that an inversion of said DUT output has occurred when said inversion is detected, said inversion detection output being resettable;
- a comparing circuit means for comparing said DUT output with a first expected state and for comparing said inversion detection output with a second expected state and producing a comparison result output indicative of said comparisons;
- storage means for storing expected states, including said first and second expected states, and for applying said expected states to said comparing circuit means;
- control means for controlling said pulse generator, said storage means and said inversion detecting means, and for reading said comparison result output; and
- said control means including:
  - first commanding means for commanding said pulse generator to output pulses to said DUT;
  - second commanding means for commanding said storage means to apply said first and second expected values to said comparing circuit means when n–1 pulses are output to said DUT by said pulse generator where said first and second expected states correspond with said DUT output and said inversion comparison output, respectively, when said DUT functions correctly following application of said n–1 pulses, and where said DUT output becomes inverted following application of n pulses;
  - first reading means for reading in said comparison result output following application of said n–1 pulses as a pre-inversion comparison result;
  - third commanding means for resetting said comparison result output and commanding said storage means to apply a second set of said first and second expected values to said comparing circuit means subsequent to reading in said pre-inversion comparison result, where said first and second expected values of said second set correspond with said DUT output and said inversion comparison output, respectively, when said DUT functions correctly following application of a total of said n pulses;
  - second reading means for reading in said comparison result output following application of said n pulses as a post-inversion comparison result; and
  - determining means for determining whether any of said pre-inversion result and said post-inversion result are a negative result and indicating that said DUT is unacceptable in response to said negative result.

7. A test apparatus for testing a DUT, comprising:
- a pulse generator for generating predetermined numbers of pulses for application to said DUT;
- an inversion detecting means for detecting inversions of a DUT output of said DUT and setting an inversion detection output to a state indicating that an inversion of said DUT output has occurred when said inversion is detected, said inversion detection output being resettable;
- a comparing circuit means for comparing said DUT output with a first expected state and for comparing said inversion detection output with a second expected state and producing a comparison result output indicative of said comparisons;
- storage means for storing expected states, including said first and second expected states, and for applying said expected states to said comparing circuit means;
- control means for controlling said pulse generator, said storage means and said inversion detecting means, and for reading said comparison result output; and
- said control means including:
  - first means for commanding said pulse generator to output pulses to said DUT, said first means for commanding said pulse generator including means for commanding said pulse generator to apply n–1 pulses to said DUT and means for commanding said pulse generator to apply one pulse to said DUT following reading of said pre-inversion comparison result;
  - second commanding means for commanding said storage means to apply said first and second expected values to said comparing circuit means prior to the occurrence of said n–1 pulses where said first and second expected states correspond with said DUT output and said inversion comparison output, respectively, when said DUT functions correctly following application of said n−1 pulses, and where said DUT output becomes inverted following application of n pulses;

first reading means for reading in said comparison result output following application of said n−1 pulses as a pre-inversion comparison result;

third commanding means for resetting said comparison result output and commanding said storage means to apply a second set of said first and second expected values to said comparing circuit means subsequent to reading in said pre-inversion comparison result, where said first and second expected values of said second set correspond with said DUT output and said inversion comparison output, respectively, when said DUT functions correctly following application of a total of said n pulses, second reading means for reading in said comparison result output following application of said n pulses as a post-inversion comparison result; and determining means for determining whether any of said pre-inversion result and said post-inversion result are a negative result and indicating that said DUT is unacceptable in response to said negative result.

8. A method of testing a DUT comprising the steps of:

commanding a pulse generator to output pulses to said DUT where a DUT output remains constant without inverting for n−1 pulses and inverts when n pulses are applied;

making a first inversion determination as to whether an inversion has occurred during application of n−1 pulses to said DUT by sensing whether an edge transition of said DUT output occurs and setting said first inversion determination in response thereto;

determining whether the first inversion determination corresponds with said DUT functioning normally following application of n−1 pulses;

determining whether said DUT output corresponds with said DUT functioning normally following application of n−1 pulses;

applying one more pulse to said DUT for a total of n pulses;

making a second inversion determination as to whether an inversion has occurred during application of n pulses to said DUT by sensing whether an edge transition of said DUT output occurs and setting said second inversion determination in response thereto;

determining whether the second inversion determination corresponds with said DUT functioning normally following application of n pulses;

determining whether said DUT output corresponds with said DUT functioning normally following application of n pulses; and determining that said DUT is unacceptable if any of the above determinations does not correspond with said DUT functioning normally.

9. The testing apparatus of claim 2 wherein said clock inputs of said first and second flip-flops are edge triggered.

10. The testing apparatus of claim 1 wherein said edge transition includes at least one of a rising edge and a falling edge of said tested output.

11. The testing apparatus of claim 1 wherein said edge transition includes both a rising edge and a falling edge of said tested output and said detection output is set to indicate said inversion of said output state of the tested output has occurred when at least one of said rising edge and said falling edge of said tested output occurs.

12. The test apparatus of claim 6 wherein application of said n−1 pulses does not result in said DUT output inverting.

13. The test apparatus of claim 7 wherein application of said n−1 pulses does not result in said DUT output inverting.

14. The IC rest apparatus of claim 4 wherein said detecting circuit means for detecting an inversion of said output state of said test output of said IC under test includes a detector responsive to an edge transition of said test output and sets said output of said detecting circuit means to said state indicative of said inversion occurring when said edge transition of said test output occurs.

15. The testing apparatus of claim 14 wherein said edge transition includes at least one of a rising edge and a falling edge of said test output.

16. The testing apparatus of claim 14 wherein said edge transition includes both a rising edge and a falling edge of said test output and said detection output is set to indicate said inversion of said output state of the test output has occurred when at least one of said rising edge and said falling edge of said test output occurs.

17. The test apparatus of claim 5 wherein said edge transition includes at least one of a rising edge and a falling edge of said DUT output.

18. The test apparatus of claim 5 wherein said edge transition includes both a rising edge and a falling edge of said DUT output and said detection output is set to indicate said inversion of said DUT output has occurred when at least one of said rising edge and said falling edge of said DUT output occurs.

19. The test apparatus of claim 6 wherein said inversion detecting means is responsive to an edge transition of said DUT output and includes a detector for detecting said edge transition of said DUT output and sets said inversion detection output to said state indicative of an inversion occurring in response to said edge transition being detected.

20. The test apparatus of claim 19 wherein said edge transition includes at least one of a rising edge and a falling edge of said DUT output.

21. The test apparatus of claim 19 wherein said edge transition includes both a rising edge and a falling edge of said DUT output and said detection output is set to indicate said inversion of said DUT output has occurred when at least one of said rising edge and said falling edge of said DUT output occurs.

22. The test apparatus of claim 7 wherein said inversion detecting means is responsive to an edge transition of said DUT output and includes a detector for detecting said edge transition of said DUT output and sets said inversion detection output to said state indicative of an inversion occurring in response to said edge transition being detected.

23. The test apparatus of claim 22 wherein said edge transition includes at least one of a rising edge and a falling edge of said DUT output.

24. The test apparatus of claim 22 wherein said edge transition includes both a rising edge and a falling edge of said DUT output and said detection output is set to indicate said inversion of said DUT output has occurred when at least one of said rising edge and said falling edge of said DUT output occurs.

* * * * *